(12) United States Patent
Vobecky et al.

(10) Patent No.: US 8,395,244 B2
(45) Date of Patent: Mar. 12, 2013

(54) FAST RECOVERY DIODE

(75) Inventors: Jan Vobecky, Lenzburg (CH); Kati Hemmann, Bremgarten (CH); Hamit Duran, Turgi (CH); Munaf Rahimo, Uezwil (CH)

(73) Assignee: ABB Technology AG, Zurich (CH)

( * ) Notice: Subject to any disclaimer, the term of this patent is extended or adjusted under 35 U.S.C. 154(b) by 246 days.

(21) Appl. No.: 12/942,410

(22) Filed: Nov. 9, 2010

(65) Prior Publication Data

US 2011/0108953 A1 May 12, 2011

(30) Foreign Application Priority Data

Nov. 9, 2009 (EP) .................................... 09175421

(51) Int. Cl.
*H01L 21/02* (2006.01)
(52) U.S. Cl. ........ 257/655; 257/109; 257/112; 257/492; 257/487; 257/E21.352; 438/380
(58) Field of Classification Search .................. 257/655, 257/109, 112, 492, 487, E21.352; 438/380
See application file for complete search history.

(56) References Cited

U.S. PATENT DOCUMENTS

| | | | | |
|---|---|---|---|---|
| 5,061,972 A | * | 10/1991 | Edmond | 257/77 |
| 2003/0197247 A1 | * | 10/2003 | Mauder et al. | 257/603 |
| 2005/0116249 A1 | | 6/2005 | Mauder et al. | |
| 2007/0007587 A1 | * | 1/2007 | Barthelmess et al. | 257/330 |
| 2008/0079119 A1 | | 4/2008 | Inque | |
| 2008/0173968 A1 | | 7/2008 | Schulze et al. | |

FOREIGN PATENT DOCUMENTS

| | | |
|---|---|---|
| EP | 0 657 945 A2 | 6/1995 |
| EP | 1 014 453 A1 | 6/2000 |

OTHER PUBLICATIONS

Search Report issued on Mar. 26, 2010, by the European Patent Office for Application No. 09175421.8.
Vobecky et al., "Helium irradiated high-power P-i-N diode with low ON-state voltage drop", Solid-State Electronics, 2003, pp. 45-50, vol. 47.
Vobecky, Radiation-Enhanced Diffusion of Palladium for a Local Lifetime Control in Power Devices, Jun. 2007, pp. 1521-1526, vol. 54, No. 6.

(Continued)

*Primary Examiner* — Marc Armand
*Assistant Examiner* — Eva Yan Montalvo
(74) *Attorney, Agent, or Firm* — Buchanan Ingersoll & Rooney PC (57) ABSTRACT

A fast recovery diode includes an n-doped base layer having a cathode side and an anode side opposite the cathode side. A p-doped anode layer is arranged on the anode side. The anode layer has a doping profile and includes at least two sublayers. A first one of the sublayers has a first maximum doping concentration, which is between $2*10^{16}$ cm$^{-3}$ and $2*10^{17}$ cm$^{-3}$ and which is higher than the maximum doping concentration of any other sublayer. A last one of the sublayers has a last sublayer depth, which is larger than any other sublayer depth. The last sublayer depth is between 90 to 120 μm. The doping profile of the anode layer declines such that a doping concentration in a range of $5*10^{14}$ cm$^{-3}$ and $1*10^{15}$ cm$^{-3}$ is reached between a first depth, which is at least 20 μm, and a second depth, which is at maximum 50 μm. Such a profile of the doping concentration is achieved by using aluminum diffused layers as the at least two sublayers.

18 Claims, 4 Drawing Sheets

OTHER PUBLICATIONS

Sze, "Physics of Semiconductor Devices, 2nd Edition", 1981, pp. 78, XP-002574541.

Kim et al., "Electrical characterization of proton irradiated p+ -n-n+ Si diode", Physica B, 2006, pp. 181-184.

Nishiwaki et al., "A Fast & Soft Recovery Diode with Ultra Small Qrr (USQ-Diode) Using Local Lifetime Control by He Ion Irradiation", Proceedings of the 13th International Symposium on Power Semiconductor Devices & ICS, Jun. 4, 2001, pp. 235-238.

* cited by examiner

FAST RECOVERY DIODE

RELATED APPLICATION

This application claims priority under 35 U.S.C. §119 to European Patent Application No. 09175421.8 filed in Europe on Nov. 9, 2009, the entire content of which is hereby incorporated by reference in its entirety.

FIELD

The present disclosure relates to the field of power electronics. More particularly, the present disclosure relates to a fast recovery diode, such as a fast recovery diode for devices with a breakdown voltage above 2.5 kV, and to a method for manufacturing such a fast recovery diode.

BACKGROUND INFORMATION

A known diode includes an n-doped base layer having a cathode side and an anode side opposite the cathode side. On the anode side, a p-doped anode layer is arranged, and a metal layer which functions as an anode electrode is arranged on top of the p-doped anode layer. A higher (n+) doped cathode buffer layer is arranged on the cathode side. A metal layer in the form of a cathode electrode is arranged on top of the (n+) doped cathode buffer layer.

Figure 1:
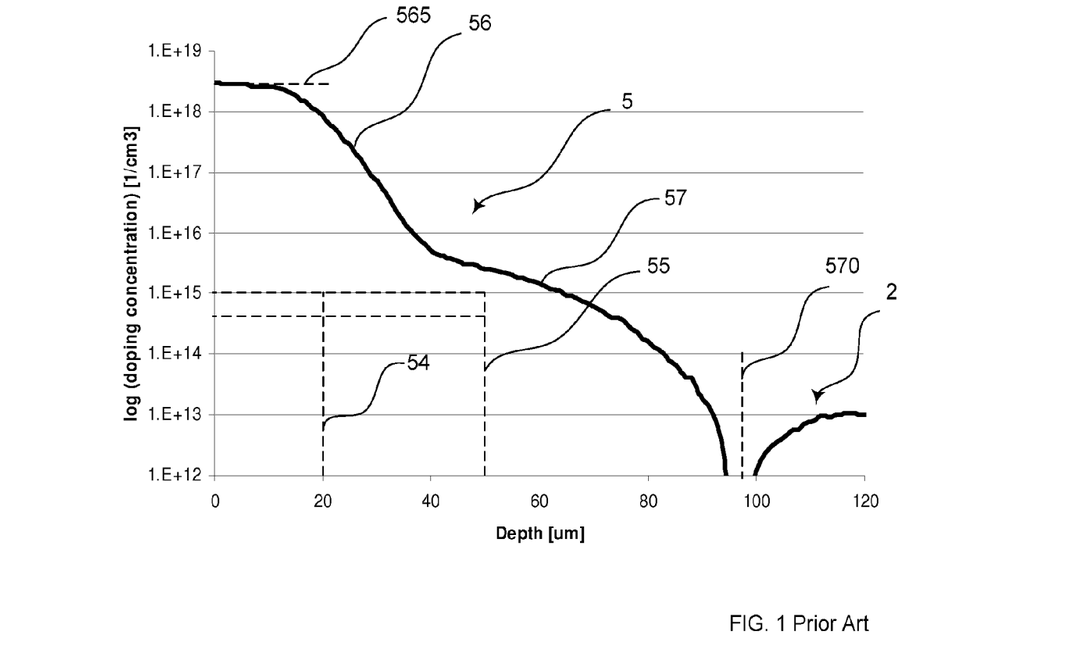
FIG. 1 shows a doping concentration of the anode layer in a known fast recovery diode.

FIG. 1 shows the doping profile of a known p-doped anode layer 5, which includes two sublayers 56, 57. The sublayer 56 is a boron or gallium diffused layer, which has a high maximum doping concentration 565 of around $1*10^{18}/cm^3$ or higher. Another sublayer with a higher sublayer depth 570 than the other sublayer and a lower maximum doping concentration is an aluminum diffused layer. Due to the high maximum doping concentration 565, the doping profile declines steeply to the sublayer depth 570.

Under fast reverse recovery with steep changes of current (high di/dt), the safe operation area (SOA) of fast recovery diodes is seriously limited by dynamic avalanche breakdown. This is the avalanche breakdown when the electric field is strongly increased by free carriers passing through the high electric field region with saturation velocity. The adjective "dynamic" reflects the fact that this occurs during transient device operation (see S. Linder, Power Semiconductors, EPFL Press, 2006). With increasing recovery di/dt, the dynamic avalanche gets stronger and leads to a device failure under much lower supply voltages as compared to a static breakdown voltage.

Methods for the suppression of dynamic avalanche are based on a proper shaping of the ON-state plasma distribution in the n-base layer of diodes by means of lifetime control. This can be done by single defect peak proton or helium irradiation combined with electron irradiation or heavy metal diffusion, multiple defect peak proton or helium irradiation, or a combination of proton or helium irradiation. Also, a controlled and low anode injection efficiency combined with lifetime control is a possible way to suppress the dynamic avalanche.

The above-mentioned methods are widely used in practice. However, they just remove the effect by decreasing the amount of free carriers passing through the high electric field region and not the cause, which is the high electric field. A method that suppresses the origin of dynamic avalanche and postpones its appearance towards higher supply voltages is based on the introduction of a thick buried low doped p-type layer, which is created by high energy Palladium ion irradiation followed by a diffusion step, and which layer is connected to an anode p-layer (see Vobecky et al, Radiation-Enhanced Diffusion of Palladium for a Local Lifetime Control in Power Devices, IEEE Transactions on Electron Devices, Vol. 54, 1521-1526). The p-layer has very low concentration of acceptors that smoothes out the peak electric field at the anode junction that is responsible for impact ionization leading to an avalanche breakdown. The beneficial effect of this layer increases with increasing thickness while the concentration is kept as close as possible to that of the n-base layer doping. However, this method requires high energy ion irradiation, for which special apparatus are needed. Furthermore, the concentration of the buried P-type layer depends on the quality of the anode surface. For wafers with a large diameter, this method requires delicate application, because a homogeneous temperature distribution during annealing, which is required for a controlled p-layer, is difficult to achieve. There is also a contamination risk during the manufacturing process due to the usage of Palladium.

SUMMARY

An exemplary embodiment provides a fast recovery diode. The exemplary diode includes an n-doped base layer having a cathode side and an anode side opposite the cathode side. The exemplary diode also includes a p-doped anode layer on the anode side. The anode layer has a doping profile and includes at least two sublayers, which are arranged parallel to the anode side. The at least two sublayers include a first sublayer and a last sublayer. The first sublayer has a first maximum doping concentration, which is between $2*10^{16}$ cm$^{-3}$ and $2*10^{17}$ cm$^{-3}$. The first maximum doping concentration is higher than the maximum doping concentration of any other sublayer of the at least two sublayers. The last sublayer has a last sublayer depth, which is larger than any other sublayer depth. The last sublayer depth being between 90 to 120 μm. The doping profile of the anode layer declines such that a doping concentration in a range of $5*10^{14}$ cm$^{-3}$ and $1*10^{15}$ cm$^{-3}$ is reached between a first depth, which is at least 20 μm, and a second depth, which is at maximum 50 μm. The at least two sublayers are aluminium diffused layers.

An exemplary embodiment provides a method for manufacturing a fast recovery diode. The exemplary method includes providing an n-doped wafer having a cathode side and an anode side opposite the cathode side, and arranging a p-doped anode layer on the anode side. The anode layer has a doping profile and includes at least two sublayers in the manufactured diode. The at least two sublayers include at least a first sublayer and a last sublayer. The exemplary method also includes creating each sublayer by applying Aluminum ions on the anode side of the wafer and diffusing the applied Aluminum ions into the wafer to create the corresponding sublayer with a sublayer depth and a maximum doping concentration, respectively. The first sublayer is created with a first maximum doping concentration, which is between $2*10^{16}$ cm$^{-3}$ and $2*10^{17}$ cm$^{-3}$ and which is higher than the maximum doping concentration of any other sublayer. The last sublayer is created with a last sublayer depth, which is larger than any other sublayer depth. The last sublayer depth is between 90 to 120 μm. The doping concentrations and sublayer depths of the at least two sublayers are such that the doping profile of the anode layer declines to a value in a range of $5*10^{14}$ cm$^{-3}$ and $1*10^{15}$ cm$^{-3}$ between a first depth, which is at least 20 μm, and a second depth, which is at maximum 50 μm.

BRIEF DESCRIPTION OF THE DRAWINGS

Additional refinements, advantages and features of the present disclosure are described in more detail below with reference to exemplary embodiments illustrated in the drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Exemplary embodiments of the present disclosure provide a fast recovery diode, in which a dynamic avalanche occurs at higher voltages and a static breakdown voltage is increased as compared to known devices.

According to an exemplary embodiment, the fast recovery diode includes an n-doped base layer having a cathode side and an anode side opposite the cathode side. A p-doped anode layer is arranged on the anode side. An anode electrode is arranged on top of the anode layer, i.e. on the side opposite the base layer. The anode electrode can be in the form of a metal layer, for example. The anode layer includes at least two aluminium diffused sublayers, wherein a first sublayer has a first maximum doping concentration, which lies between $2*10^{16}$ cm$^{-3}$ and $2*10^{17}$ cm$^{-3}$ and which first maximum doping concentration is higher than the maximum doping concentration of any other sublayer. The anode layer further includes a last sublayer with a last sublayer depth, which is larger than any other sublayer depth of all sublayers. The last sublayer depth is between 90 to 120 µm. Each sublayer has a doping profile. The doping profile of the anode layer is composed of the doping profiles of all sublayers such that a doping concentration in a range of $5*10^{14}$ cm$^{-3}$ and $1*10^{15}$ cm$^{-3}$ is reached between a first depth, which is at least 20 µm, and a second depth, which is at maximum 50 µm, such as 40 µm, for example.

Such a doping profile allows for the provision of a fast recovery diode, in which the electric field is reduced at a given reverse voltage as compared to known devices and thus, the dynamic avalanche can be postponed towards higher supply voltages. The doping profile is advantageous, for example, for fast recovery diode with a breakdown voltage above 2.5 kV.

In contrast to known methods, in which a defect layer is introduced by irradiation with protons, electrons or heavy metal diffusion, an exemplary embodiment of the present disclosure provides that, in the diode, the cause of the avalanche, i.e. the high electric field, is weakened, and thereby also the static breakdown voltage is increased. At the same time, low and controlled emitter injection efficiency and proper lifetime control are provided. In the diode according to the exemplary embodiments of the present disclosure, the defect layers are also used to control the lifetime. Furthermore, provisions are made to suppress the dynamic avalanche. All of these effects contribute to make more rugged diodes.

The method for manufacturing the inventive diode is also advantageous to known methods for the production of discrete high power diodes. There is no high energy ion irradiation to create the optimal anode doping profile, which is not easily available in a factory.

According to an exemplary embodiment, the need for special material requirements for manufacturing are dispensed with, where such special material requirements could imply delicate handling during the manufacturing. As no critical materials are used, there is no contamination risk during manufacturing. As the created slope of doping profile of the anode layer is smooth, there are no special requirements to the anode sided surface of the wafer. Furthermore, the exemplary method is easy to perform, which also allows for the creation of large sized wafers.

According to an exemplary embodiment, the diode can be used as a free-wheeling or clamping diode in IGCT (Integrated gate commutated thyristor) and/or a free-wheeling diode in IGBT (insulated gate bipolar transistor) applications.

In the exemplary embodiments described below, various components are described as having n-type or p-type conductivity. The present disclosure is not limited to the illustrated embodiments. For example, it is to be understood that the conductivity types can also be reversed.

Figure 4:
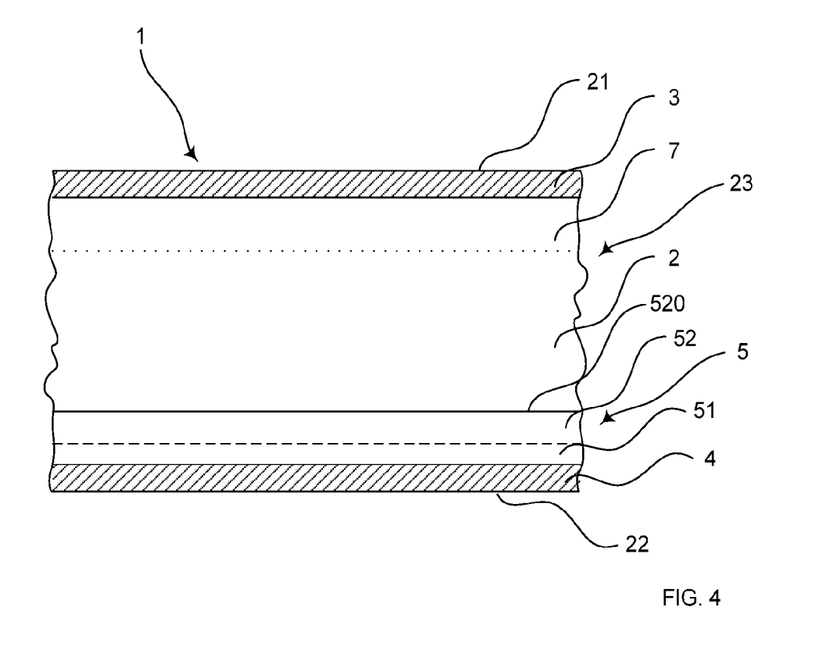
FIG. 4 shows a cross section of an exemplary diode according to an embodiment of the present disclosure.

FIG. 4 shows a fast recovery diode 1 according to an exemplary embodiment of the present disclosure. The fast recovery diode 1 includes a wafer 23. Part of the wafer 23 with unamended doping during the manufacturing process forms an n-doped base layer 2 having a cathode side 21 and an anode side 22 opposite the cathode side 21. The base layer 2 has a low doping concentration. On the cathode side 21, there may optionally be an n-doped cathode buffer layer 7 arranged (dotted line in FIG. 4). In case the diode 1 has such a cathode buffer layer 7, the cathode buffer layer 7 can have a higher doping concentration than the n-doped base layer 2. A cathode electrode 3 is arranged on top of the cathode buffer layer 7 on the side of the cathode buffer layer 7 opposite the base layer 2. For a device without a cathode buffer layer 7, the cathode electrode 3 is arranged directly on top of the base layer 2.

Figure 2:
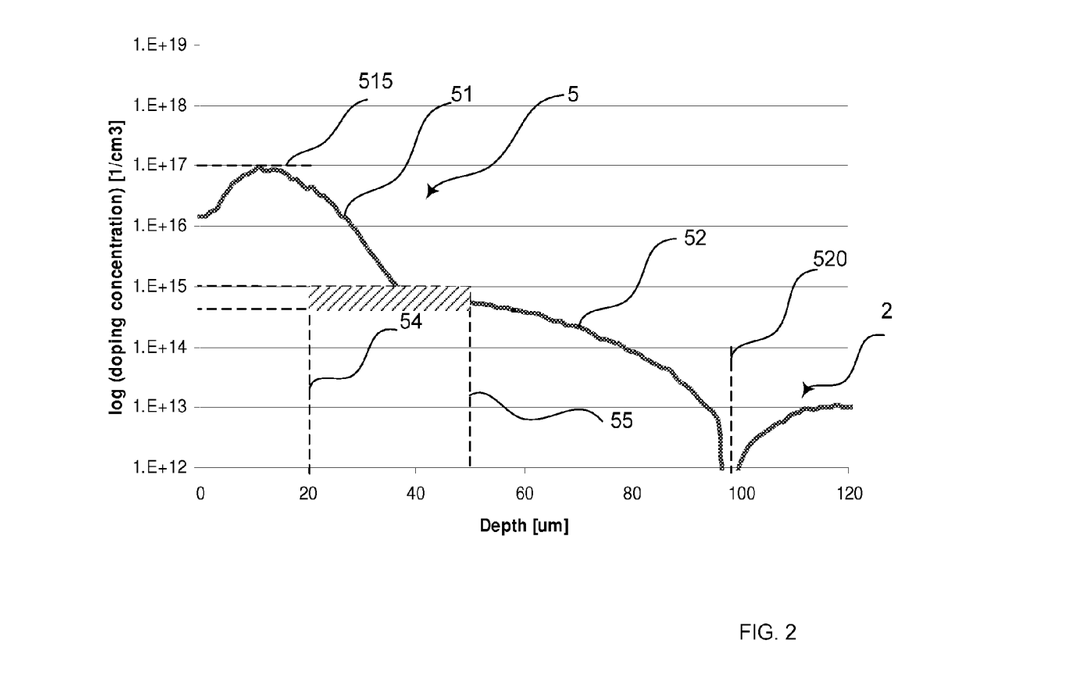
FIG. 2 shows a doping concentration of the anode layer in an exemplary fast recovery diode according to an embodiment of the present disclosure.

An anode electrode 4 is arranged on the anode side 22 of the wafer. According to an exemplary embodiment, the cathode electrode 3 and/or anode electrode 4 can be in the form of a metal layer. A p-doped anode layer 5 is arranged on the anode side 22 between the base layer 2 and the anode electrode 4. As shown in FIG. 2, the anode layer 5 includes a first sublayer 51 and a second sublayer 52. The first sublayer 51 has a first maximum doping concentration 515, which is between $2*10^{16}$ cm$^{-3}$ and $2*10^{17}$ cm$^{-3}$ and which is higher than the maximum doping concentration than the second sublayer 52 (or any other sublayer). The second sublayer 52 has a second sublayer depth 520, which is larger than the first sublayer depth 51 (or any other sublayer depth). This second sublayer depth 520 is between 90 to 120 µm. The sublayers 51, 52 are arranged parallel to the anode side 22.

The anode layer 5 in FIG. 2 has a doping profile, which is composed of the doping profiles of all sublayers, i.e. the doping concentrations of all sublayers for each depth. The doping profile of the anode layer proceeds such that between a first depth 54, which is at least 20 μm, and a second depth 55, which is at maximum 50 μm, a doping concentration in a range of $5*10^{14}$ cm$^{-3}$ and $1*10^{15}$ cm$^{-3}$ is reached.

According to an exemplary embodiment, the two sublayers 51, 52 can be aluminium diffused layers. Aluminum allows for the deep creation of such sublayers in a silicon wafer, by which a smooth gradient of the anode layer doping concentration is created over the depth.

In an exemplary embodiment, the first depth 54 is at least 30 μm. In another exemplary embodiment, the second depth 55 is at maximum 40 μm.

The depths are measured from the anode sided surface of the anode layer 5.

Figure 7:
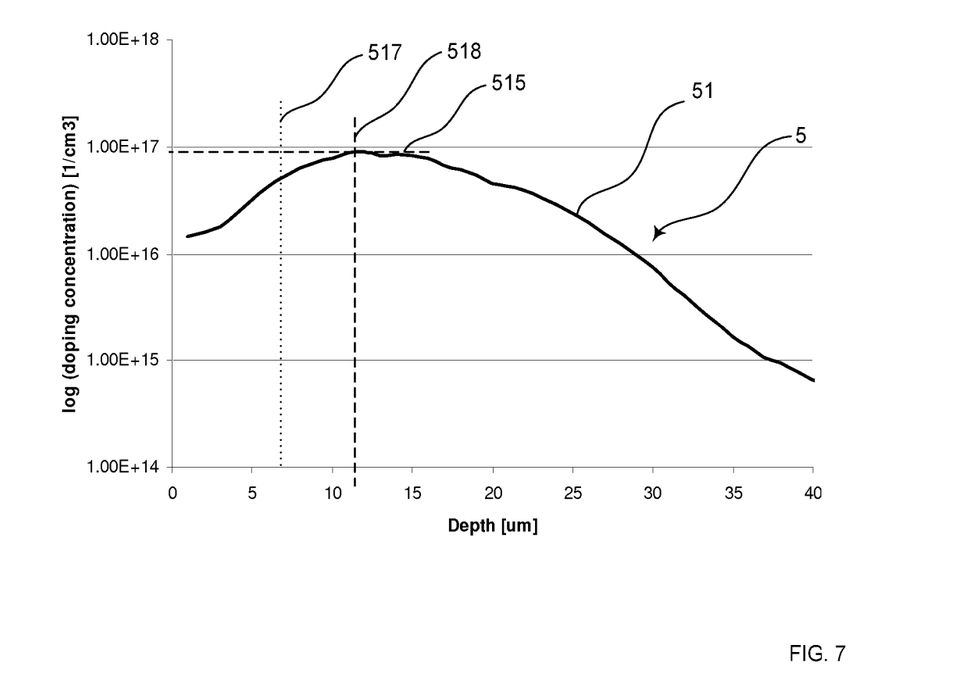
FIG. 7 shows a detailed view on the doping concentration of the first sublayer in an exemplary diode according to an embodiment of the present disclosure.

The device may include a first sublayer 51 with a first maximum doping concentration 515, which maximum is achieved within a certain depth from the wafer surface on the anode side (see FIG. 7, for example) or the first maximum doping concentration 515 may be present on the surface of the wafer, thereby reducing the thickness of the device.

Figure 3:
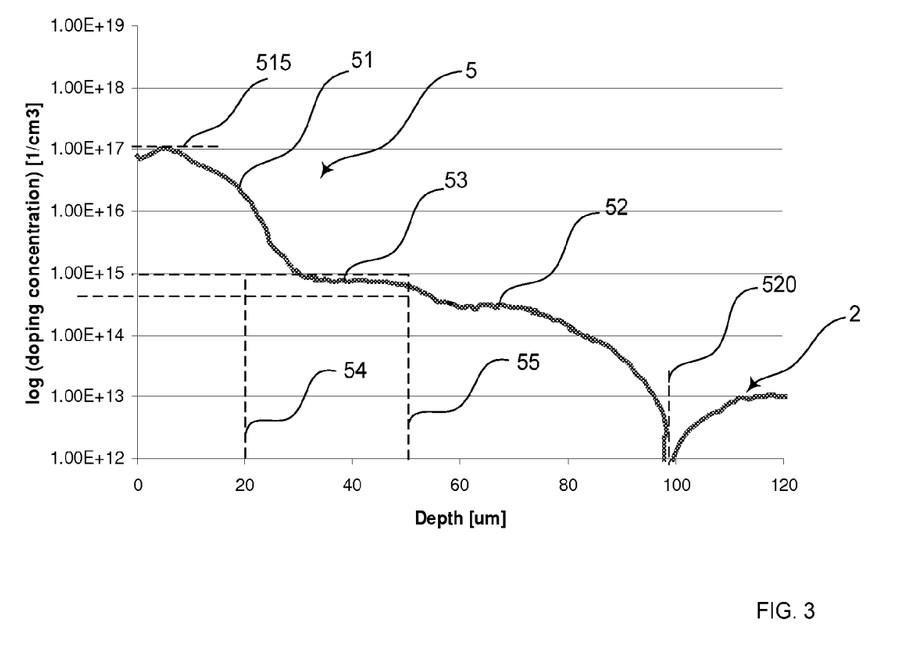
FIG. 3 shows a doping concentration of the anode layer in an exemplary fast recovery diode according to an embodiment of the present disclosure.

According to an exemplary embodiment, the diode may include an anode layer 5, which includes two sublayers, a first sublayer 51 and a last (e.g., second) sublayer 52, as shown in FIG. 2. According to another exemplary embodiment, the anode layer 5 may include more sublayers, as shown in FIG. 3, for example, in which the anode layer 5 includes three sublayers 51, 52, 53. Of course, the anode layer 5 may also include more than three sublayers 51, 52, 53. Such intermediate sublayers 53 have sublayer depths, which are located between the first sublayer depth and the last (e.g., second) sublayer depth 520. The last (e.g., second) sublayer depth is in any case larger than any other sublayer depth of the at least two sublayers.

The maximum doping concentration of a sublayer with a larger sublayer depth is always lower than the maximum doping concentrations of those sublayers with a lower sublayer depth. As a result, the doping profile of the anode layer 5 declines with a larger depth from the wafer surface. In the overlap region between two sublayers, there may be a short area, in which the doping profile rises until the maximum doping concentration of the deeper sublayer is reached, but the overall tendency of the doping profile is that it declines with distance from the anode sided wafer surface.

As shown in the exemplary embodiment illustrated in FIG. 8, the diode 1 may further include a defect layer 6 with a defect peak, which is arranged in a depth beyond the depth, in which a doping concentration is declined to a value below $1*10^{15}$ cm$^{-3}$, and smaller than the second depth (55). In this depth, the defect peak is outside the space charge region (SCR) so that the leakage current is not increased. By having the very low doping concentration gradient (flat doping profile), the wafer is less sensitive to changes of the irradiation energy or to any coarseness of the surface of the wafer in order to create the defect layer which causes reproducible pinning of the ON-state plasma (electrons and holes with similar concentration much higher than an n-doped base layer) into the anode doping profile, and therefore achieve reproducible forward voltage drop and ruggedness at fast reverse recovery.

In smaller depths, the doping profile is steeper, and therefore, it is advantageous to control the depth very tightly and the necessary defect concentration of the defect layer as well. At the same time, the electron-hole plasma would be pinned at a higher doping concentration and so the device ruggedness would be lower.

Figure 5:
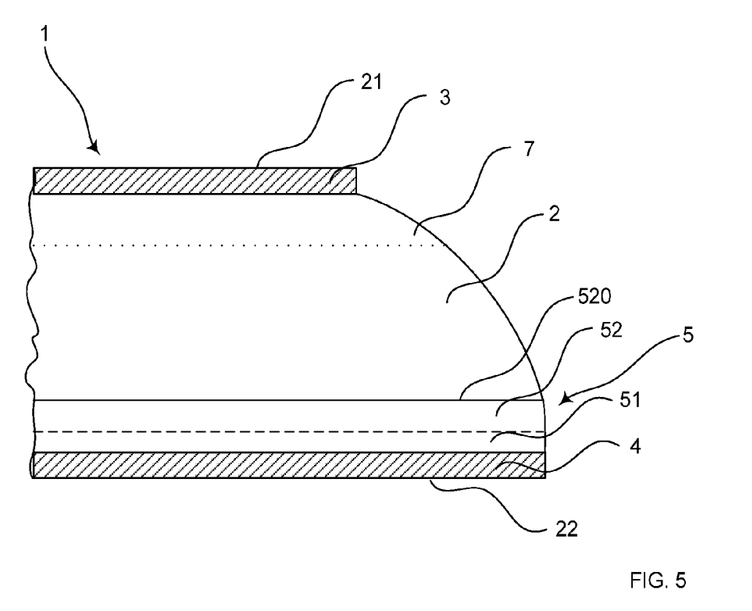
FIG. 5 shows the edge termination of an exemplary diode according to an embodiment of the present disclosure.
Figure 6:
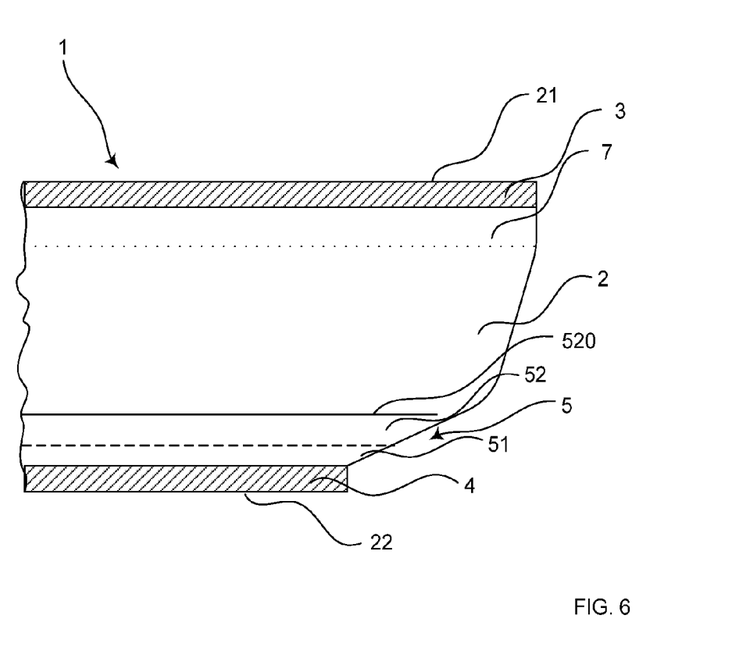
FIG. 6 shows the edge termination of an exemplary diode according to an embodiment of the present disclosure.

As shown in FIG. 5, the diode 1 may optionally have edge terminations like positive bevels, which means that the diode 1 has a smaller width at the cathode side 21 than at the anode side 22, or negative bevels as shown in FIG. 6, which means that the diode 1 has a larger width at the cathode side 21 than at the anode side 22. The width of the device is the distance between the lateral sides of the device, whereas the lateral sides are the sides between the cathode side 21 and the anode side 22. The diode 1 can also be terminated by guard rings or VLD (Variation of Lateral Doping).

For devices with a positive or negative bevel, there is an angle of the lateral side of a wafer, which side is arranged between the cathode side 21 and the anode side 22. This angle is different from 90°. In case of a positive bevel, the angle measured from the cathode side 21 inside the silicon is larger than 90°. For a negative bevel, the angle measured inside the silicon is larger than 90° when measured at the anode side 22. With a negative bevel, the electric field can be reduced on the bevel over a great length due a small doping concentration gradient, which gives advantages in the increased static blocking for the device. This effect is further enhanced by the doping profile according to the exemplary embodiments of the present disclosure. Exemplary advantages of the bevel termination are the easy manufacturing of discrete diodes and lower leakage current as compared to the guard rings and VLD.

An exemplary embodiment of the present disclosure also provides a method for manufacturing a fast recovery diodej. The exemplary method can include the following steps. An n-doped wafer 23 with a cathode side 21 and an anode side 22 opposite the cathode side 21 is provided. A p-doped anode layer 5, which includes two sublayers 51, 52 in the finalized diode 1 according to an exemplary embodiment, is arranged on the anode side 22. The sublayers are arranged parallel to the anode side 22. Each sublayer 51, 52 is created by applying Aluminum ions, for example, on the anode side 22, and afterwards diffusing the Aluminum ions into the wafer 23, thereby creating a sublayer with a sublayer depth and a maximum doping concentration.

A first sublayer 51 is created with a first maximum doping concentration 515, which is between $2*10^{16}$ cm$^{-3}$ and $2*10^{17}$ cm$^{-3}$, for example, and which is higher than the maximum doping concentration of any other sublayer 52, 53. A last (e.g., second) sublayer 52 is created with a last (e.g., second) sublayer depth 520, which is larger than any other sublayer depth, wherein the last sublayer depth 520 is between 90 to 120 μm, for example. The doping concentrations and sublayer depths of the two sublayers 51, 52 are chosen such that the doping profile of the anode layer declines to a value in the range of $5*10^{14}$ cm$^{-3}$ and $1*10^{15}$ cm$^{-3}$, for example, between a first depth, which is at least 20 μm, and a second depth 55, which is at maximum 50 μm, e.g., 40 μm. The Aluminum ions for the creation of the sublayers can be applied by surface deposition or by ion implantation, for example. Afterwards, the Aluminum ions are diffused into the wafer to the desired depth.

Depending of the method for applying the Aluminum ions onto the wafer surface, the ions can be deposited only at one side, i.e. the anode side 22 (like in the ion implantation method) or on both sides of the wafer (anode and cathode side 21, 22 as in a surface deposition method). In case of double sided application, the ions on the cathode side 21 are removed, e.g. by etching or polishing, and then the ions are driven-in only at the anode side 22. Cathode sided processes on the wafer can be performed after finishing the drive-in of the Aluminum atoms, but the present disclosure is not limited to this order of processes. Metal layers for the cathode and anode electrode 3, 4 can be deposited on the cathode and anode side 21, 22 after finalizing the layers in the wafer. A defect layer or layers 6 may be created even after the creation of the metal layers as electrodes 3, 4.

As an alternative to a fast recovery diode with an anode layer 5 including two sublayers 51, 52, the anode layer 5 may include a plurality of sublayers, e.g. three sublayers 51, 52, 53, or more. In any case, the first sublayer 51 is the sublayer with the highest maximum doping concentration, and the last sublayer 52 is the sublayer with the largest depth of all sublayers.

All sublayers are created such that a sublayer having a larger sublayer depth has a lower maximum doping concentration than those sublayers with a lower sublayer depth.

As Aluminum diffuses in all directions, part of the Aluminum ions also diffuse out of the wafer during the diffusion step. Therefore, the first sublayer 51 can have a first maximum doping concentration 515, which is located in some depth from the anode side 22 (see FIG. 7, which is a detailed view of the doping concentration around the maximum doping concentration from FIG. 2). It is possible after having diffused the Aluminum ions into the wafer 23, to remove that part of the first sublayer 51, which is arranged between the anode sided surface of the wafer and the maximum doping concentration of the first sublayer. That part can be removed either partly 517 or completely 518 (removing the part left from the dashed line 518 in the example of FIG. 7 leads to a complete removal of the part, which is arranged between surface and the first maximum dose concentration 515. For a partial removal, the part to the left from the dotted line 517, for example, can be removed). Removal 517, 518 of a part of the first sublayer 51 can be performed by etching, grinding or any other appropriate method, by which material is removed from the anode side of the wafer.

Figure 8:
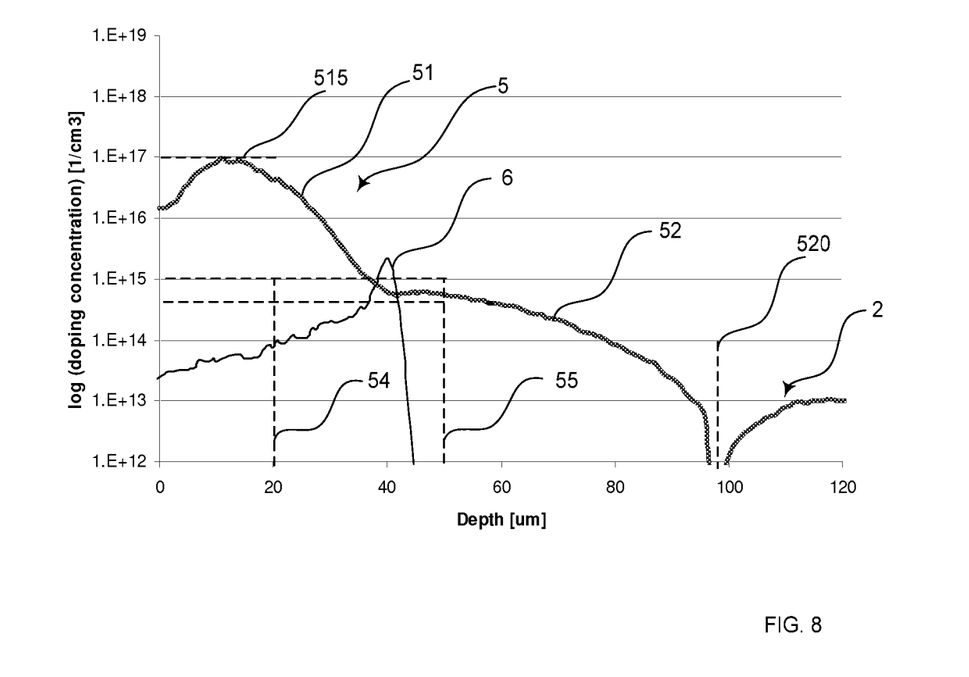
FIG. 8 shows a doping concentration of the anode layer in an exemplary fast recovery diode with a defect layer according to an embodiment of the present disclosure.

The exemplary diode 1 can also include a defect layer 6 (FIG. 8). For the creation of such a defect layer 6, the wafer 23 is irradiated on the anode side 22 with light ions. The irradiation energy of these ions is chosen such that a defect layer 6 is created with a defect peak, which is arranged in a depth beyond the depth, in which a doping concentration below $1*10^{15}$ cm$^{-3}$ is reached, and smaller than the second depth (55), i.e. in a depth outside the space charge region. According to an exemplary embodiment, protons or helium can be used as ions for the creation of the defect layer 6.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST diode 1
base layer 2
cathode side 21
anode side 22
wafer 23
cathode electrode 3
anode electrode 4
anode layer 5
first sublayer 51
first maximum doping concentration 515
partial removal 517
complete removal 518
last sublayer 52
last sublayer depth 520
second sublayer 53
first depth 54
second depth 55
sublayer 56
maximum doping concentration of sublayer 56 565
sublayer 57
depth of sublayer 57 570
defect layer 6

What is claimed is:

1. A fast recovery diode comprising:
an n-doped base layer having a cathode side and an anode side opposite the cathode side;
a p-doped anode layer on the anode side, the anode layer having a doping profile and comprising at least two sublayers, which are arranged parallel to the anode side, wherein:
the at least two sublayers comprise a first sublayer and a last sublayer;
the first sublayer has a first maximum doping concentration, which is between $2*10^{16}$ cm$^{-3}$ and $2*10^{17}$ cm$^{-3}$, the first maximum doping concentration being higher than the maximum doping concentration of any other sublayer of the at least two sublayers;
the last sublayer having a last sublayer depth, which is larger than any other sublayer depth, the last sublayer depth being between 90 to 120 µm;
the doping profile of the anode layer declines such that a doping concentration in a range of $5*10^{14}$ cm$^{-3}$ and $1*10^{15}$ cm$^{-3}$ is reached between a first depth, which is at least 20 µm, and a second depth, which is at maximum 50 µm; and
wherein the at least two sublayers are aluminum diffused layers.

2. The diode according to claim 1, wherein the first depth is at least 30 µm.

3. The diode according to claim 1, wherein the second depth is at maximum 40 µm.

4. The diode according to claim 1, wherein the diode has a larger width at the cathode side than at the anode side.

5. The diode according to claim 1, wherein the diode has a smaller width at the cathode side than at the anode side.

6. The diode according to claim 1, comprising:
a defect layer having a defect peak, the defect layer being arranged parallel to the anode side with the defect peak in a depth beyond a depth in which the doping concentration of the anode layer is declined below $1*10^{15}$ cm$^{-3}$, and smaller than the second depth.

7. A method for manufacturing a fast recovery diode, the method comprising:
providing an n-doped wafer having a cathode side and an anode side opposite the cathode side;
arranging a p-doped anode layer on the anode side, the anode layer having a doping profile and comprising at least two sublayers in the manufactured diode, the at least two sublayers comprising at least a first sublayer and a last sublayer; and
creating each sublayer by applying Aluminum ions on the anode side of the wafer and diffusing the applied Aluminum ions into the wafer to create the corresponding sublayer with a sublayer depth and a maximum doping concentration, respectively, wherein:
the first sublayer is created with a first maximum doping concentration, which is between $2*10^{16}$ cm$^{-3}$ and $2*10^{17}$ cm$^{-3}$ and which is higher than the maximum doping concentration of any other sublayer;

the last sublayer is created with a last sublayer depth, which is larger than any other sublayer depth, the last sublayer depth being between 90 to 120 µm; and the doping concentrations and sublayer depths of the at least two sublayers are such that the doping profile of the anode layer declines to a value in a range of $5*10^{14}$ cm$^{-3}$ and $1*10^{15}$ cm$^{-3}$ between a first depth, which is at least 20 µm, and a second depth, which is at maximum 50 µm.

8. The method according to claim 7, comprising:

irradiating the wafer on the anode side with ions to create a defect layer having a defect peak, wherein the irradiation energy is such that the defect peak is arranged in a depth beyond a depth in which the doping concentration of the anode layer is declined below $1*10^{15}$ cm$^{-3}$, and smaller than the second depth.

9. The method according to claim 8, wherein the ions for the creation of the defect layer are one of protons and helium.

10. The method according to claim 7, comprising:

after diffusing the Aluminum ions into the wafer, removing at least a part of the first sublayer which is arranged between the wafer surface on the anode side and the first maximum doping concentration.

11. A device comprising an Integrated Gate Commutated Thyristor and a diode according to claim 1.

12. The diode according to claim 2, wherein the second depth is at maximum 40 µm.

13. The diode according to claim 12, wherein the diode has a larger width at the cathode side than at the anode side.

14. The diode according to claim 12, wherein the diode has a smaller width at the cathode side than at the anode side.

15. The diode according to claim 13, comprising:

a defect layer having a defect peak, the defect layer being arranged parallel to the anode side with the defect peak in a depth beyond a depth in which the doping concentration of the anode layer is declined below $1*10^{15}$ cm$^{-3}$, and smaller than the second depth.

16. The diode according to claim 14, comprising:

a defect layer having a defect peak, the defect layer being arranged parallel to the anode side with the defect peak in a depth beyond a depth in which the doping concentration of the anode layer is declined below $1*10^{15}$ cm$^{-3}$, and smaller than the second depth.

17. A device comprising an Insulated Gate Bipolar Transistor and a diode according to claim 1.

18. The method according to claim 7, comprising:

after diffusing the Aluminum ions into the wafer, completely removing a part of the first sublayer which is arranged between the wafer surface on the anode side and the first maximum doping concentration.

* * * * *